US008467117B2

(12) United States Patent
Walther et al.

(10) Patent No.: US 8,467,117 B2
(45) Date of Patent: Jun. 18, 2013

(54) PATTERN GENERATION SYSTEMS AND HIGH BANDWIDTH FOCUS CONTROL SYSTEM WITH SUPPRESSED REACTION FORCES AND NOISE

(75) Inventors: Jonas Walther, Solna (SE); Torbjörn Hedevärn, Stockholm (SE)

(73) Assignee: Micronic Mydata AB, Taby (SE)

( * ) Notice: Subject to any disclaimer, the term of this patent is extended or adjusted under 35 U.S.C. 154(b) by 372 days.

(21) Appl. No.: 12/923,088

(22) Filed: Sep. 1, 2010

(65) Prior Publication Data

US 2011/0051211 A1 Mar. 3, 2011

Related U.S. Application Data

(60) Provisional application No. 61/272,206, filed on Sep. 1, 2009.

(51) Int. Cl.
*G02B 26/08* (2006.01)
(52) U.S. Cl.
USPC ..................... 359/201.1; 359/221.1
(58) Field of Classification Search
USPC .......................... 359/196.1–226.3
See application file for complete search history.

(56) References Cited

U.S. PATENT DOCUMENTS

| | | | | |
|---|---|---|---|---|
| 1,913,867 A | * | 6/1933 | Wood | 369/119 |
| 4,023,126 A | * | 5/1977 | Schlafer | 355/51 |
| 4,155,620 A | * | 5/1979 | Rawson | 359/215.1 |
| 4,170,397 A | * | 10/1979 | Botcherby et al. | 359/210.1 |
| 5,210,635 A | * | 5/1993 | Nagata et al. | 359/198.1 |
| 5,339,188 A | * | 8/1994 | Fritzel | 359/200.1 |
| 6,188,502 B1 | * | 2/2001 | Aoki | 359/198.1 |
| 6,201,639 B1 | * | 3/2001 | Overbeck | 359/368 |
| 6,386,716 B2 | * | 5/2002 | Hagelin et al. | 359/871 |
| 7,298,538 B2 | * | 11/2007 | Guynn et al. | 359/200.1 |
| 7,372,606 B2 | * | 5/2008 | Broome et al. | 359/216.1 |
| 7,982,936 B2 | * | 7/2011 | Broome et al. | 359/216.1 |
| 2004/0190097 A1 | * | 9/2004 | Shpizel et al. | 359/198 |
| 2006/0132882 A1 | * | 6/2006 | DeBenedictis et al. | 359/196 |
| 2006/0226732 A1 | * | 10/2006 | Savic et al. | 310/309 |
| 2006/0250675 A1 | * | 11/2006 | Willemsen et al. | 359/224 |
| 2008/0030826 A1 | * | 2/2008 | Sissom et al. | 359/225 |
| 2008/0259428 A1 | * | 10/2008 | Zimdars et al. | 359/211 |
| 2009/0153935 A1 | * | 6/2009 | Kajino | 359/221.2 |

FOREIGN PATENT DOCUMENTS

| | | |
|---|---|---|
| EP | 0 292 976 | 11/1988 |
| WO | WO 2010/063830 | 6/2010 |

OTHER PUBLICATIONS

International Preliminary Examination Report dated Sep. 14, 2011 for International Application No. PCT/EP2010/005358.
International Search Report dated Dec. 22, 2010 in International Application No. PCT/EP2010/005358.
Haruki Tokumaru, et al. "Multibeam Optical System Incorporating a Microlens Array." Japanese Journal of Applied Physics, Japan Society of Applied Physics, JP, vol. 35, No. 1B, Jan. 1, 1996, pp. 375-379.
International Search Report and Written Opinion, dated Apr. 15, 2011 for International Application No. PCT/EP2010/005358.

* cited by examiner

*Primary Examiner* — Jennifer L. Doak
(74) *Attorney, Agent, or Firm* — Harness, Dickey & Pierce, P.L.C.

(57) ABSTRACT

A pattern generation system includes an optical system and a rotor. The optical system is configured to project a laser image onto an optical scanner. The rotor has a plurality of optical arms arranged at a first angle relative to one another, and further includes the optical scanner. The laser image is sequentially reflected by the optical scanner into each of the plurality of optical arms of the rotor to generate a pattern on a workpiece.

39 Claims, 10 Drawing Sheets

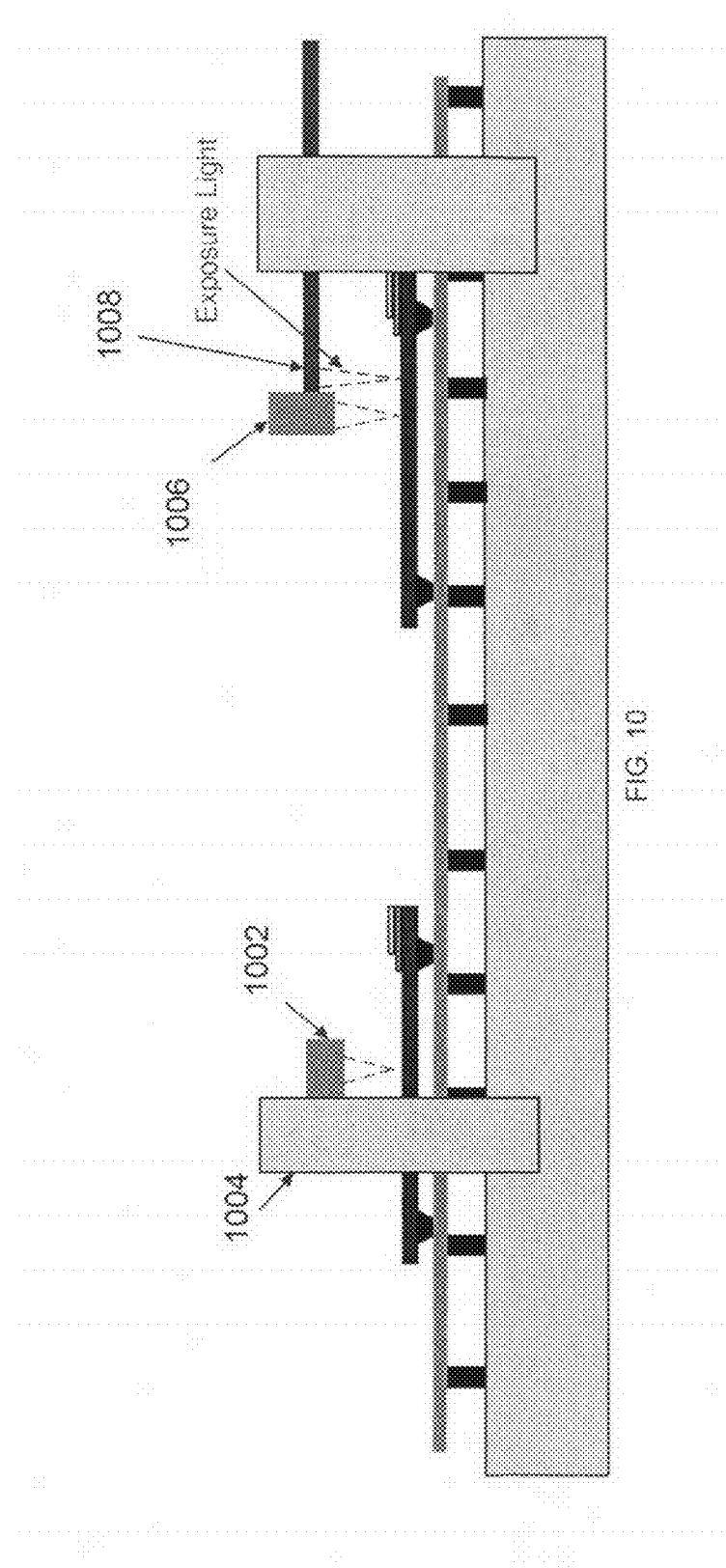

PATTERN GENERATION SYSTEMS AND HIGH BANDWIDTH FOCUS CONTROL SYSTEM WITH SUPPRESSED REACTION FORCES AND NOISE

CROSS-REFERENCE TO RELATED APPLICATION(S)

This non-provisional U.S. patent application claims priority under 35 U.S.C. §119(e) to provisional U.S. patent application No. 61/272,206, filed on Sep. 1, 2009, the entire contents of which are incorporated herein by reference.

TECHNICAL FIELD

Example embodiments relate to pattern generators, pattern generation systems, tools, focus control systems, methods, apparatuses and systems for scanning of workpieces and/or substrates (e.g., relatively large flat substrates for reading and writing patterns or images).

BACKGROUND

Description of the Related Art

In some related art pattern generation systems, a stage advances a workpiece in one direction, while a head scans the workpiece in a perpendicular direction. Pattern generation systems having a stationary workpiece and an x-y-movable scanning head, or a stationary head and an x-y-movable stage are also known.

A potential problem with pattern generation systems having movable scanning heads is that the scanning head may need services such as cooling water, gas and/or radio frequency (RF) cables. The bending of the cables may also negatively affect reliability and/or performance of the system. Likewise, many related art pattern generation systems are relatively heavy, bulky and/or otherwise unsuitable for relatively fast movements.

Moreover, a related art pattern generation system in which all movement is performed by the x-y stage may have issues with size, weight and/or may be unsuitable for relatively fast movements.

Both types of pattern generation systems may also have problems with relatively large inertias and/or relatively high mechanical overhead, which may limit the speed and/or agility of the scanning.

SUMMARY

The present invention describes a method and system, or apparatus, for processing a workpiece, where the system comprises a plurality of rotating optical arms and an optical scanner.

In certain embodiments of the invention, the system comprises a focusing system for refocusing a writer (or reader) beam during the patterning (or measuring) of a workpiece. The focusing system may be provided with position information and/or workpiece topography information from a focus sensor and/or a focus sensor system.

Example embodiments provide focus systems that may be less (e.g., significantly less) sensitive to translations and/or rotations of the rotor (e.g., z- and y-translations, and x-rotation).

Focus motors according to example embodiments may be applicable to all or substantially all systems with multiple lenses having a common focus, in which relatively fast projection swaps are used and in which suppressed (e.g., minimum) vibration generation is required.

Some example embodiments provide rotating pattern generation systems.

At least one example embodiment provides a pattern generation system or other tool including: an optical system and a rotor. The optical system is configured to project a laser image onto an optical scanner. The rotor includes: a plurality of optical arms arranged at a first angle relative to one another; and the optical scanner. The laser image is sequentially reflected by the optical scanner into each of the plurality of optical arms of the rotor to generate a pattern on a workpiece.

At least one other example embodiment provides a rotor for implementation in a pattern generator or other tool. According to at least this example embodiment, the rotor includes: an optical scanner; and a plurality of optical arms arranged at a first angle relative to one another. A laser image is sequentially reflected by the optical scanner into each of the plurality of optical arms of the rotor to generate a pattern on a workpiece.

The optical scanner may be a pyramid optical scanner in the form of a prism or the like.

According to at least some example embodiments, each of the plurality of optical arms may print an image scan with a certain bow length on the workpiece. Each optical arm may operate sequentially to print a corresponding image scan, where the time periods during which each optical arm prints the corresponding image scan do not overlap.

The laser image may be in the form of a static beam, and a projection swap between each of the plurality of optical arms may occur when the static beam reaches an edge of the optical scanner.

The optical scanner and the plurality of optical arms may rotate at a constant or substantially constant speed. The optical scanner and the plurality of optical arms may rotate at the same or substantially the same speed.

According to at least some example embodiments, the pattern generation system may further include: a focusing system configured to change a nominal focus position according to a topography map of the workpiece and/or focus length variations between the plurality of optical arms during and/or after a projection swap between the plurality of optical arms.

According to at least one example embodiment, the focusing system may further include: a deformable mirror configured to refocus a writing beam for projecting the laser image. A beam splitter configured to direct light reflected from the deformable mirror toward a plane to generate the pattern on the workpiece may also be included.

In at least one other example embodiment, the focusing system may include: a focusing apparatus configured to change the nominal focus position according to a topography map of the workpiece and/or focus length variations between the plurality of optical arms during and/or after a projection swap between the plurality of optical arms; and a focus motor configured to drive the focusing apparatus.

The pattern generation system may further include: a focus sensor or focus sensor system configured to provide position information to the focus motor.

A focus sensor may provide "real-time" position information for dynamic refocusing during simultaneous scanning of an optical arm processing (e.g., imaging or measuring) the workpiece. Alternatively, a focus sensor may provide position information from a previous scan of the workpiece.

The focus sensor providing the position information (e.g., height variations) may be located in the same or a different optical arm as the optical arm using the position information for writing/measuring of the workpiece. In certain example embodiments, the focus sensor system may include an array of sensors configured to provide a workpiece topography map, which is measured before processing the workpiece. The focus sensor system may be located in either the writing/measurement area and/or the loading area of the tool.

The focus motor may be positioned using a linear optical encoder and/or according to the position information provided by a focus sensor and/or based on a pre-measured topography map of the workpiece to be processed by the tool.

The focus motor may be positioned using a linear optical encoder and/or according to the position information provided by the focus sensor and/or based on information of the measured topography of the workpiece to be processed by the tool (e.g., a topography map).

The focus motor may include: a counterweight configured to counteract forces acting on moving portions of the pattern generation system. A motor body may be adhered to the counterweight by a thermally conductive adhesive such that heat transfers to the counterweight, which acts as a cooling flange.

The focus motor may further include: a hose connected to the counterweight. The hose may be configured to cool the focus motor by vacuum suction. A soft hose may be connected to the counterweight and configured to supply air to the counterweight. A damper ring may be mounted on the counterweight and configured to suppress damage caused by collisions between the counterweight and an actuating assembly of the focus motor. Strokes of the focus motor may adapt to different workpiece thicknesses. The focus motor may function at different nominal positions depending on a height of the workpiece.

The focus motor may further include: viscous dampers mounted at end strokes and configured to suppress crash damage to the focus motor.

According to at least some example embodiments, the pattern generation system may further include: a focusing system configured to change the focus position of a writing beam for writing the laser image based on position information from a focus sensor (e.g., a topography map of the workpiece). In one example, the focus system may include: a deformable mirror configured to refocus the writing beam.

At least one other example embodiment provides a method for generating a pattern on a workpiece. According to at least this example embodiment, the method includes: projecting, by an optical system, a laser image onto an optical scanner; and sequentially reflecting, by the optical scanner, the laser image into each of a plurality of optical arms of a rotor to generate a pattern on a workpiece.

According to at least some example embodiments, each of the plurality of optical arms may print an image scan with a certain bow length on the workpiece. Each optical arm may operate sequentially to print a corresponding image scan, and the time periods during which each of the plurality of optical arms print the corresponding image scan may not overlap. The laser image may be in the form of a static beam, and a projection swap between each of the plurality of optical arms occurs when the static beam reaches a corresponding edge of the optical scanner. The optical scanner and the plurality of optical arms may rotate at a constant or substantially constant speed.

According to at least some example embodiments, a nominal focus position may be changed according to at least one of a topography map of the workpiece and focus length variations between the plurality of optical arms during and/or after a projection swap.

According to at least some example embodiments, the focus motor may include: an acting/reacting force unit configured such that an acting/reacting force is applied in parallel with movement of an actuating portion of the focus motor.

The acting/reacting force unit may be an on-axis acting/reacting force unit having an objective enclosed in bearings. The bearings may have a center of gravity aligned with a driving force of the focus motor.

In an alternative example embodiment, the acting/reacting force unit may be an off-axis acting/reacting force unit configured such that a driving force of the focus motor is at the center of gravity and the center of gravity is in the driving force direction.

BRIEF DESCRIPTION OF THE DRAWINGS

Example embodiments will be discussed in more detail with regard to the drawings in which:

FIGS. 9 and 10 illustrate different implementations and locations of a focus sensor or array of sensors configured to provide position information to the focus system for refocusing (e.g., dynamic refocusing) and/or configured to provide a workpiece topography map prior to writing/reading on the workpiece.

DETAILED DESCRIPTION

Figure 1:
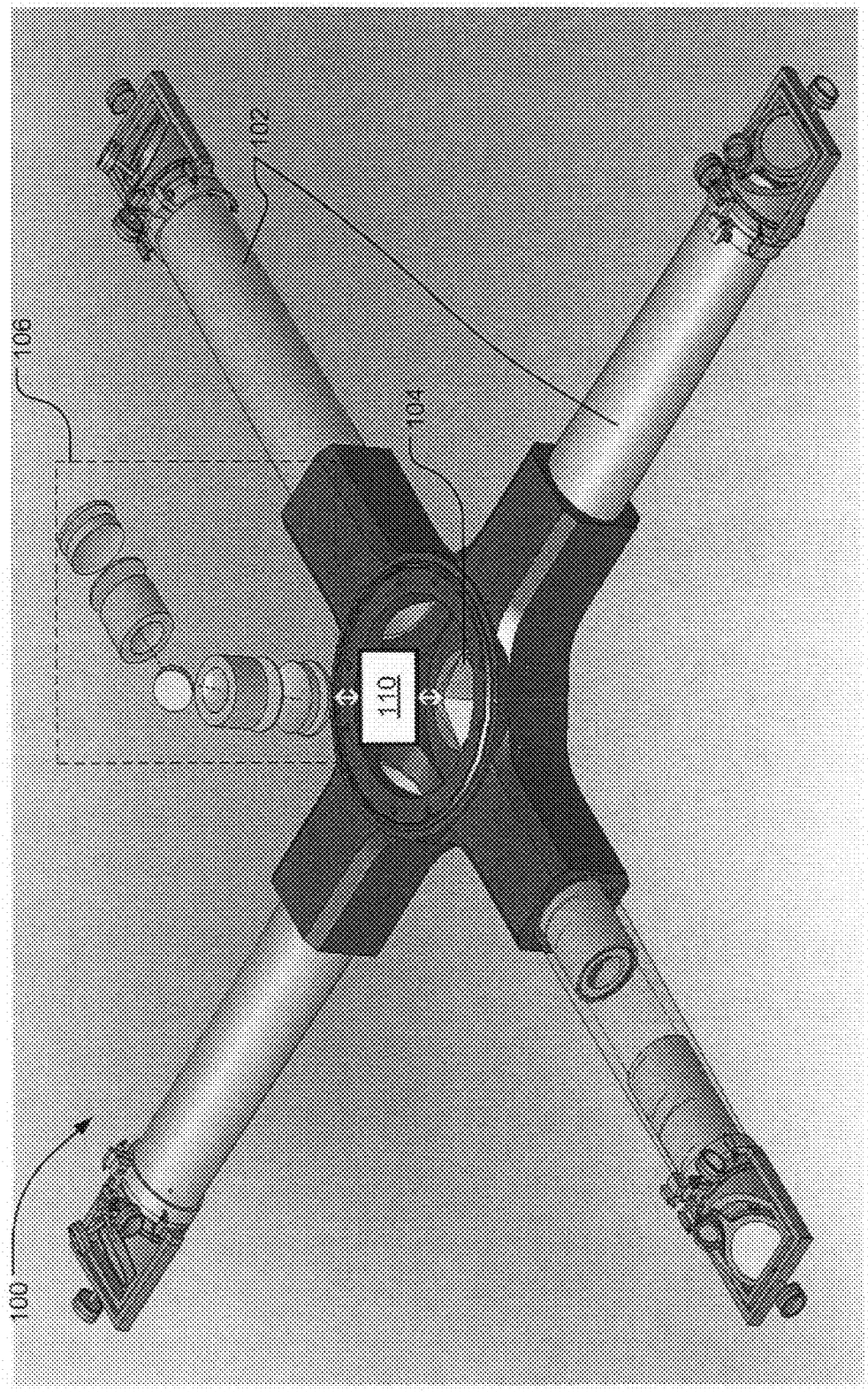
FIG. 1 illustrates a portion of a pattern generation system or other tool according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may, however, may be embodied in many alternate forms and should not be construed as limited to only the example embodiments set forth herein.

It should be understood, however, that there is no intent to limit scope to the particular example embodiments disclosed. On the contrary example embodiments are to cover all modifications, equivalents, and alternatives falling within the scope. Like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

When an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

According to at least some example embodiments, reading and writing is to be understood in a broad sense. For example, reading may include microscopy, inspection, metrology, spectroscopy, interferometry, scatterometry, a combination of one or more of the aforementioned, etc. of a relatively large substrate or workpiece. Writing may include exposing a photoresist, annealing by optical heating, ablating, creating any other change to the surface by an optical beam, etc. Example substrates include flat panel displays, printed circuit boards (PCBs), substrates or workpieces in packaging applications, photovoltaic panels, etc.

Example embodiments may be implemented in pattern generators or pattern generation systems for writing/patterning an image on a substrate, for example, a pattern generator including one or a plurality of image-generating modulators.

Example embodiments may also be used in connection with a measurement and/or inspection tool having one or a plurality of detectors, sensors (e.g., time delay and integration (TDI) sensors), or cameras (e.g., charged coupled devices (CCDs)).

Example embodiments may also be implemented in a pattern generator or pattern generation system for writing patterns on a relatively thick substrate such as a three-dimensional (3D) substrate, or may be implemented in a tool for measuring and/or inspection of a relatively thick workpiece or substrate, for example, a tool for measuring or inspecting a three-dimensional (3D) pattern in a photoresist between about 2 μm and about 100 μm, inclusive, or even thicker photoresists.

According to at least one example embodiment, a rotating pattern generation system includes a plurality of optical arms having a common optical system in which an image scan is projected and printed (written) on the substrate using one optical arm at a time. When the static incoming beam reaches an edge of the optical scanner, which is rotating together with the rest of the rotor at the same speed (e.g., at a constant or substantially constant speed), a projection swap occurs between the optical arms. In one example, the optical scanner may be a pyramid optical scanner (e.g., a prism or the like). A projection swap refers to the change in the optical arm used for projecting and printing an image on the substrate; that is, the change in projected light from one optical arm to another.

When using a plurality of optical arms in which one optical arm is projecting an image on the substrate at a time, impulse transmission to the rest of the system needs to be reduced during projection swaps. Because the height variation on the surface of the substrate being processed (e.g., written and/or measured) is likely to be larger than the focal depth of the optical system, a dynamic focus may be needed. A dynamic focus may also be needed to more rapidly change the nominal focus position due to focus length variations between optical arms during projection swaps.

A focus sensor may provide "real-time" position information for dynamic refocusing during simultaneous scanning of an optical arm processing (e.g., imaging or measuring) the workpiece. Alternatively, a focus sensor may provide position information from a previous scan of the workpiece.

The focus sensor providing the position information (e.g., height variations) may be located in the same or a different optical arm as the optical arm using the position information for writing/measuring of the workpiece.

In certain example embodiments, the focus sensor system may include an array of sensors configured to provide a workpiece topography map which is measured before processing the workpiece. The focus sensor system may be located in either the writing/measurement area and/or the loading area of the tool. The focus motor may be positioned using a linear optical encoder and/or according to the position information provided by the focus sensor and/or based on a pre-measured topography map of the workpiece to be processed by the tool.

Some example embodiments provide focus (or focusing) systems that may be less (e.g., significantly less) sensitive to translations and/or rotations of the rotor (e.g., z- and y-translations, and x-rotation).

A focusing mechanism may be managed, for example, by using a 90° mirror translating in a single axis. Because demands on accuracy of pattern placement are relatively high, relatively low noise and relatively high stiffness may be required to reduce (e.g., minimize) the amplitude of resonance frequencies. To suppress noise, a focus motor may run essentially frictionless on sintered air bearing bushings having relatively good (e.g., excellent) damping and stiffness characteristics.

The focus (or focusing) system may include a focus motor and a focus sensor, which provides position information to the focus motor. The focus motor may be positioned internally using a linear optical encoder. The required bandwidth may be set according to the time required to perform a projection swap. The projection swap angle may be reduced (e.g., minimized) to improve printing time. But, the projection swap angle may also be dependent on the adaptation and optimization of substrate size, geometrical issues and/or possible laser effect variations.

According to at least one example embodiment, the focus motor may be designed with a counterweight mass to adapt forces acting on an actuating assembly to suppress (e.g., minimize) impulse transmission to the rest of the system. The reaction forces transmitted may theoretically be scaled down by a factor of about 1700. The counterweight mass may be positioned by a spring with relatively low stiffness to reach a relatively low resonance frequency of the counterweight mass, and to suppress and/or minimize transmission. In one example, the counterweight mass may be made of stainless steel.

To further decrease impulse transmission to the rest of the system, the counterweight mass may have between about 3 and about 10 (e.g., about 5) times greater mass than the actuating assembly (moving part) and the counterweight movement/transmitted force may be reduced by the same or substantially the same factor.

The total mass may be reduced (e.g., minimized) in order to increase bandwidth on the actuating assembly. To reduce the total mass, a sensor scale may be mounted on the actuating assembly and the housing body may be made of a relatively light material (e.g., aluminium or the like). The sensor scale may be centered on the actuating assembly in the x-y plane to minimize position errors caused by undesirable rotations. An acting/reacting force unit may be positioned in the center of gravity on both assemblies to remove undesirable torque that may cause vibrations.

FIG. 1 illustrates a portion of a pattern generation system or other tool according to an example embodiment. The device/apparatus shown in FIG. 1 may be implemented in the pattern generators, pattern generation systems or other tools discussed above. But, for the sake of clarity, FIG. 1 will be discussed with regard to a pattern generation system.

Referring to FIG. 1, the pattern generation system includes: a rotor 100; a focus (or focusing) system 110; and an optical system 106. The rotor 100 has a plurality of optical arms 102 arranged at a first angle relative to one another. The rotor 100 further includes an optical scanner 104. The optical scanner 104 may be a pyramid optical scanner in the form of a prism or the like. The four optical arms 102 shown in FIG. 1 constitute a rotor with a swap angle of about 90° (about 90° separation between the optical arms). The pattern generator system may comprise an image generating device (not shown) as part of, or coupled to, the optical system 106, e.g. in form of at least one modulator such as a spatial light modulator (SLM), grating light valve (GLV) or acousto-optic modulator (AOM).

At the lower end of the optical system 106 in FIG. 1, the optical system 106 projects a laser image onto the optical scanner 104. The laser image is sequentially reflected by the optical scanner 104 into each of the plurality of optical arms 102 of the rotor 100 to generate a pattern on a substrate (not shown).

Although the rotor shown in FIG. 1 includes four optical arms 102 arranged at 90° relative to one another, rotors according to example embodiments may include any number of optical arms arranged at a variety of angles relative to one another.

According to at least some example embodiments, an image is printed on a substrate with a certain bow length at a specific position with one optical arm at a time. In this case, each of the plurality of optical arms 102 prints an image scan with a certain bow length on the substrate.

The laser image may be in the form of a static beam, and as mentioned above, a projection swap between the optical arms 102 occurs when the static incoming beam reaches the edge of the optical scanner 104, which rotates together with the rest of the rotor 100 at constant or substantially constant speed. Accordingly, each optical arm 102 operates sequentially to print a corresponding image scan, and the time periods during which each optical arm 102 prints the corresponding image scan do not overlap.

As mentioned above, example embodiments may require a dynamic focus for various reasons. Dynamic focus may be provided by the focus system 110 shown in FIG. 1.

The focus system 110 may include a focusing apparatus and a focus motor. The focus system may be configured to change the nominal focus position according to at least one of a topography map of the workpiece and focus length variations between the plurality of optical arms 102 during and/or after a projection swap between the plurality of optical arms 102. The focus motor may be configured to drive the focusing apparatus. Depending on configuration, the focus system 110 may be located at either end of the optical system 106 in FIG. 1. In the examples of a pattern generator system where an image generating device (not shown) is not part of the optical system 106, the focus system 110 may be located between the optical system 106 and the image generator device, e.g. at the upper end of the optical system 106 shown in FIG. 1.

In another example embodiment, the focusing apparatus may be configured to change the focus position of a writing beam for projecting the laser image based on position information from a focus sensor. The focus motor may be configured to drive the focusing apparatus. In this example, the focus system 110 may again be located at either end of the optical system 106 in FIG. 1.

Focus motors according to example embodiments will be described in more detail below with regard to FIGS. 2-7.

In yet another example, the focus system 110 may include a deformable mirror configured to refocus the writing beam. In one example, the deformable mirror may be located at the end of the optical system 106 in FIG. 1. An example embodiment of the deformable mirror is described in more detail below with regard to FIG. 8

Figure 2:
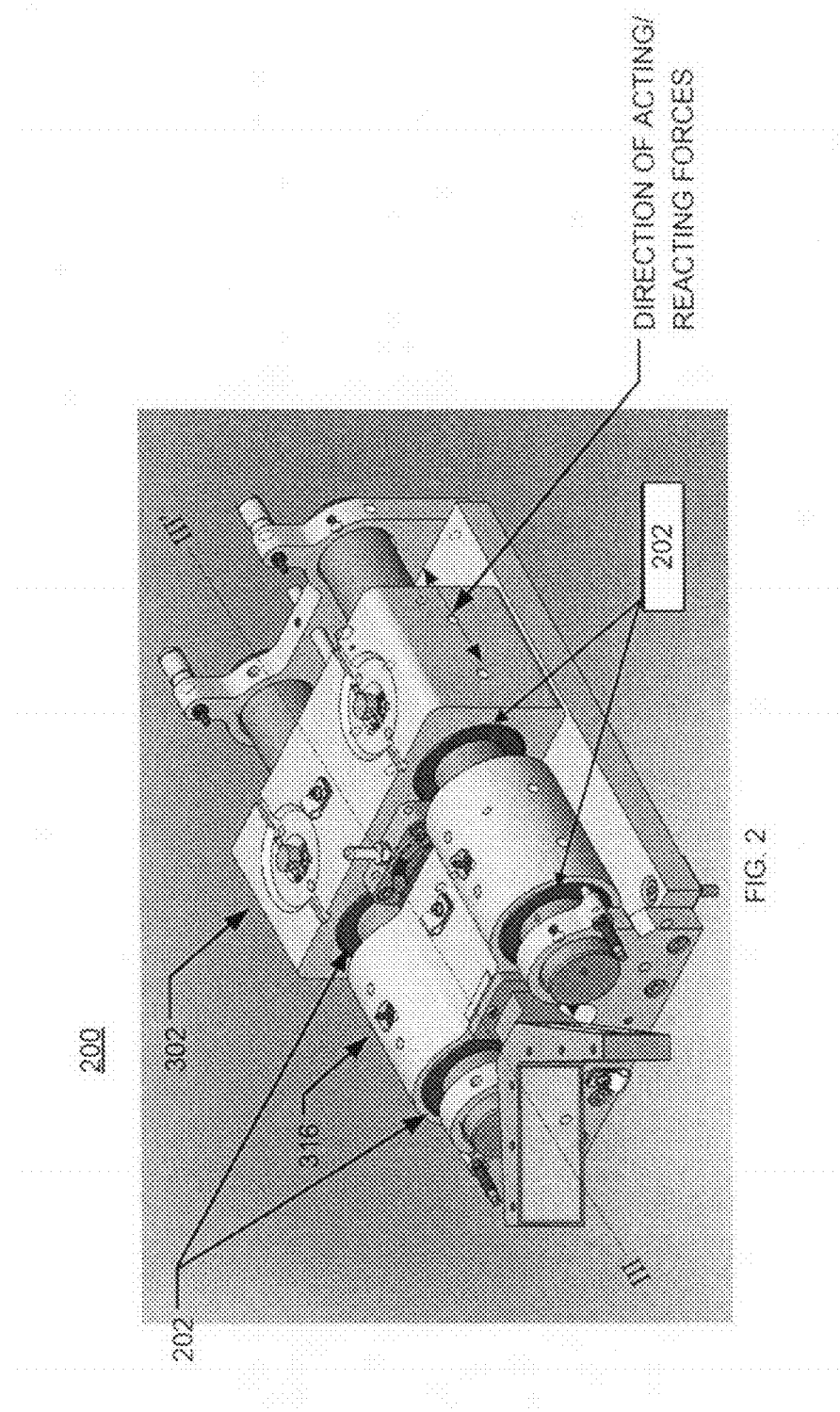
FIG. 2 is a perspective view of a focus motor according to an example embodiment.
Figure 3:
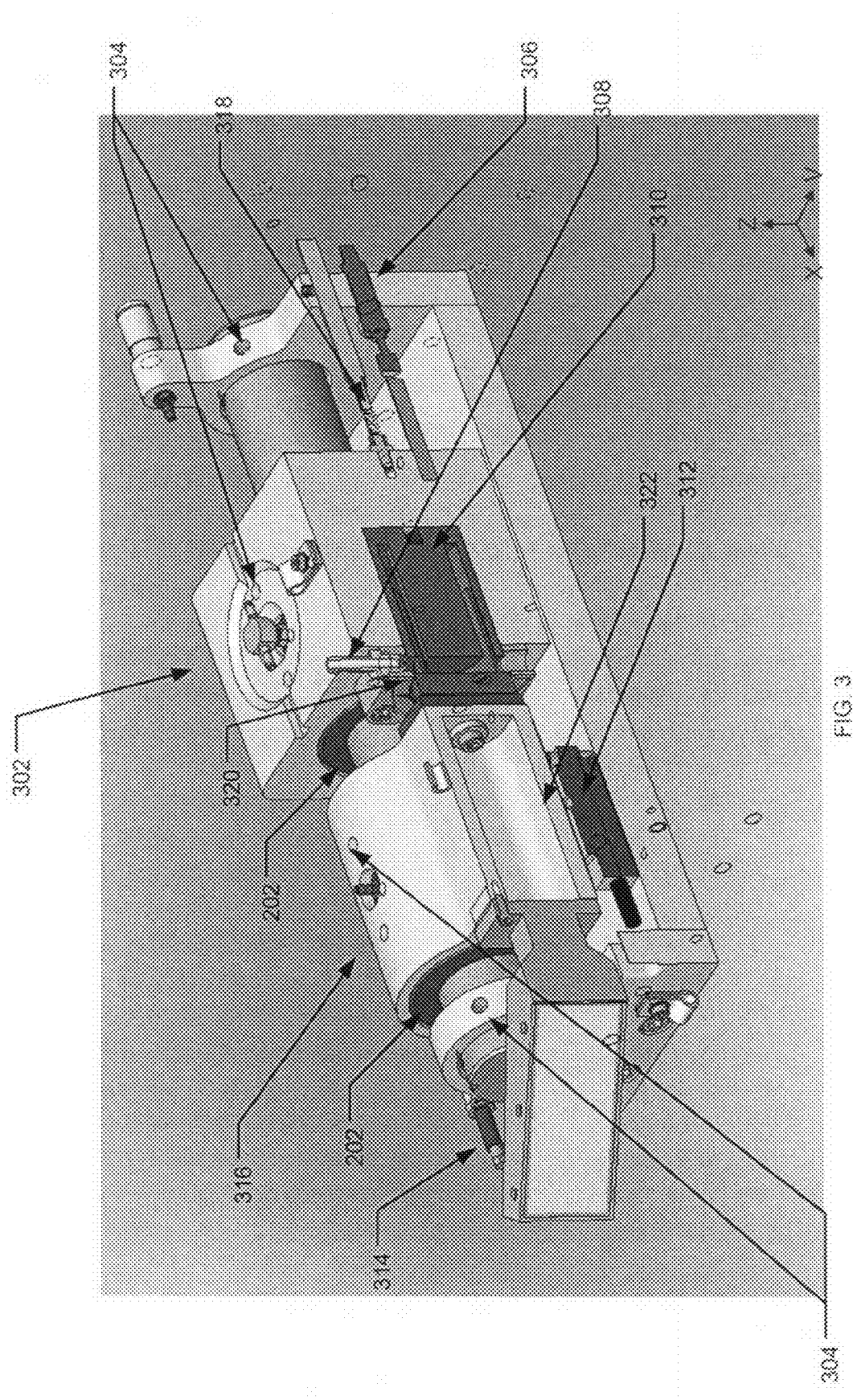
FIG. 3 is a cross-section of the focus motor 200 taken along line in FIG. 2.

FIG. 2 is a perspective view of a focus motor according to an example embodiment. FIG. 3 is a cross-section of the focus motor 200 taken along line III-III' in FIG. 2.

The focus motor 200 may be part of a focus system configured to (or itself configured to) change a nominal focus position according to at least one of a topography map of the workpiece and focus length variations between the plurality of optical arms during and/or after a projection swap.

Referring to FIGS. 2 and 3, the focus motor 200 includes, among other things, an actuating assembly 316 and a counterweight mass assembly 302, which move essentially or substantially frictionless on four sintered air bearing bushings 202 having relatively good (e.g., excellent) damping and stiffness characteristics. The counterweight mass assembly 302 is configured to counteract forces acting on moving portions of the pattern generation system.

In one example, a focus sensor may be located at the very end of the rotating optical arms 102 outside the writer beam and/or an array of sensors may be located in a loading area of the tool to measure the topography map of the workpiece before imaging. The focus sensor provides position information to the focus motor 200, and the focus motor 200 may be positioned internally using a linear optical encoder 312 and/or according to position information from the focusing sensor. The required bandwidth may be set according to the time required to perform a projection swap. As mentioned above, a projection swap refers to the changing of projected light from one optical arm to another.

Figure 9:
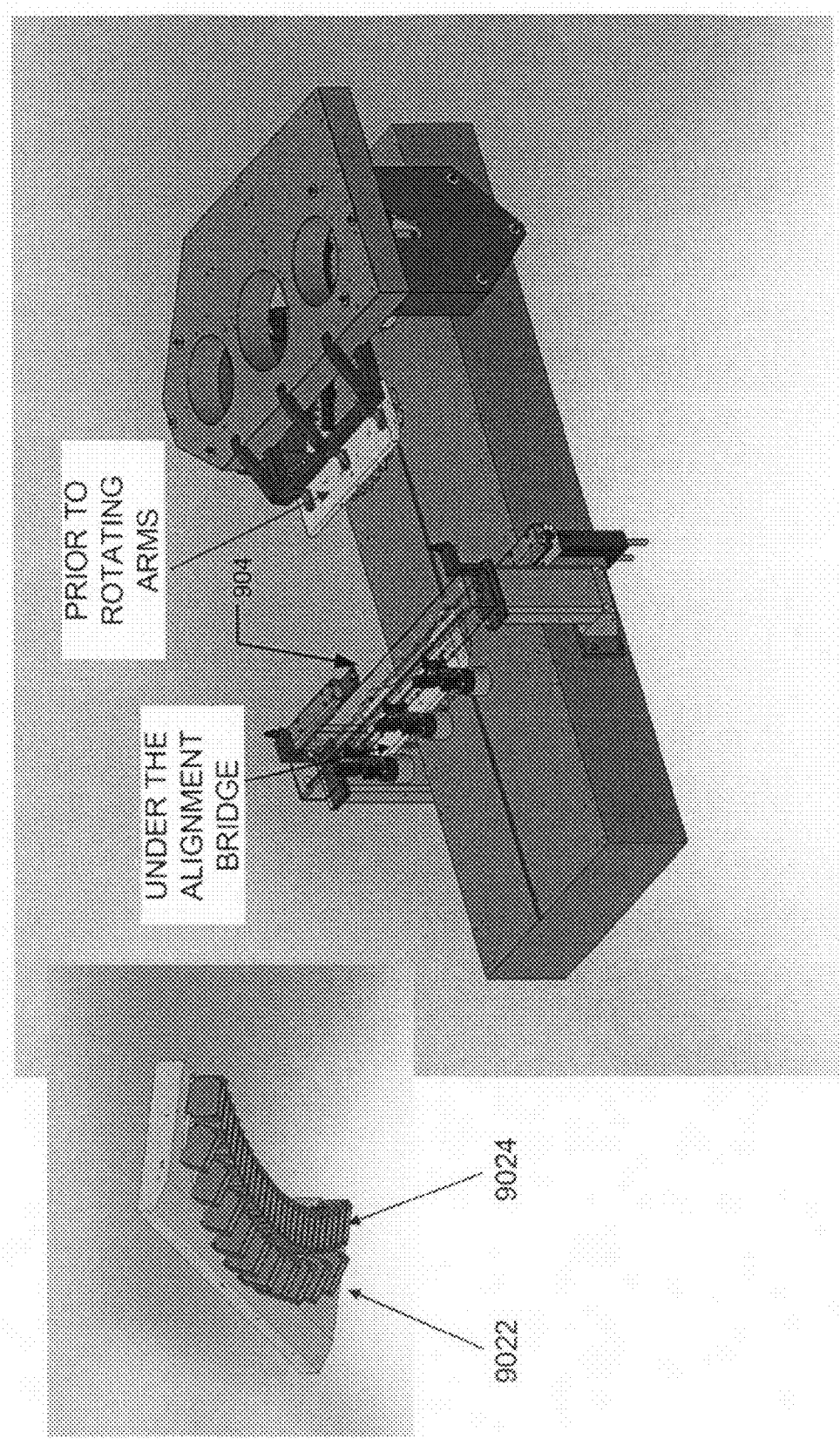

FIGS. 9 and 10 illustrate different implementations and locations of focus sensor(s) configured to provide position information to the focus system for refocusing (e.g., dynamic refocusing) and/or configured to provide a workpiece topography map prior to writing/reading on the workpiece.

As shown in FIG. 9, a focus sensor 902 may include a plurality of (e.g., about 10) direction reflection sensors 9022 and a plurality of (e.g., about 25) diffuse reflection sensors 9024. The focus sensor 902 is positioned under the alignment bridge 904 (e.g., in the loading area) and/or just prior to the location of the rotor arms (e.g., in the writing/measuring area) in a pattern generation system.

Referring to FIG. 10, the focus sensor may be a topography sensor 1002 positioned at the alignment bridge 1004 (e.g., in the loading area). FIG. 10 also shows an example embodiment in which the focus sensor 1006 is attached to one or more rotor arms 1008 (e.g., positioned in the writing/measuring area).

Although the example embodiments in FIGS. 9 and 10 show focus sensors positioned in both the loading area and the writing/measuring area, according to example embodiments the focus sensors may be positioned in only one of the loading and measuring/writing areas.

Referring back to FIGS. 2 and 3, according to at least one example embodiment, to reduce (e.g., minimize) impulse transmission to the rest of the system, the focus motor 200 includes the counterweight mass assembly 302. The transmitted reaction force may theoretically be scaled down by a factor of about 1700.

The counterweight mass 302, which may be made of stainless steel or the like, may be positioned by a spring 318 with relatively low stiffness to reach a relatively low resonance frequency of the counterweight mass assembly 302 and to suppress (e.g., minimize) transmission.

To further decrease the impulse transmission to the rest of the system, the counterweight mass assembly 302 may have between about 3 and about 10 (e.g., about 5) times greater mass than the actuating assembly 316. In this case, the counterweight movement/transmitted force may be reduced by the same factor. The total mass may be reduced (e.g., minimized) to improve (e.g., maximize) bandwidth on the actuating assembly 316.

In one example, to reduce the total mass, a sensor scale 322 may be mounted on the actuating assembly 316 and the housing body may be composed of a relatively light material (e.g., aluminium or the like). The sensor scale 322 may be centered in the x-y plane on the actuating assembly 316 to minimize position errors caused by undesirable rotations.

Acting/reacting forces may be positioned at or in the center of gravity (COG) on both the counterweight mass assembly 302 and the actuating assembly 316 to suppress (e.g., remove) undesirable torque that may cause vibrations. Example acting/reacting force units will be discussed in more detailed with regard to FIGS. 4-7. According to example embodiments, the acting/reacting force units may be positioned such that the acting/reacting forces work back and forth in the direction noted in FIG. 2.

Still referring to FIGS. 2 and 3, a motor body 310 may be glued or adhered to (into) the counterweight mass assembly 302 using a thermally conductive glue (or similar adhesive) to provide heat transfer to the counterweight mass assembly 302, which may act as a cooling flange. A motor coil mounted on the actuating assembly 316 may be thermally isolated to suppress (e.g., minimize) thermal expansion in the x-direction shown in FIG. 3 resulting in offsets in real focus position, and to reduce the likelihood of (e.g., prevent) offsets in the y-direction in FIG. 3 (e.g., between air bearings and ground). A hose 308 may be connected to a more insensitive counterweight mass assembly 302 to further increase removal of heat losses in the focus motor 200 by vacuum suction.

The focus motor 200 may be calibrated against the focus sensor. And, the stroke of the focus motor 200 may adapt to different substrate thicknesses. As a result, the focus motor 200 may work at different nominal positions depending on substrate height. To suppress (e.g., minimize) transmission of noise, an actuating assembly air supply may be connected to the counterweight mass assembly 302 by soft hoses.

Alignment is relatively (e.g., very) important and may be achieved by using an external alignment tool (not shown) and simultaneously locking the system by applying glue at different positions 304. Viscous dampers 306 and 314 for the actuating assembly 316 and the counterweight mass assembly 302 may be mounted at end strokes to suppress (e.g., prevent) crash damage.

A damper ring 320 may be mounted on the counterweight mass assembly 302 to suppress (e.g., prevent) damage if the counterweight mass assembly 302 and the actuating assembly 316 collide or hit each other.

Figure 4:
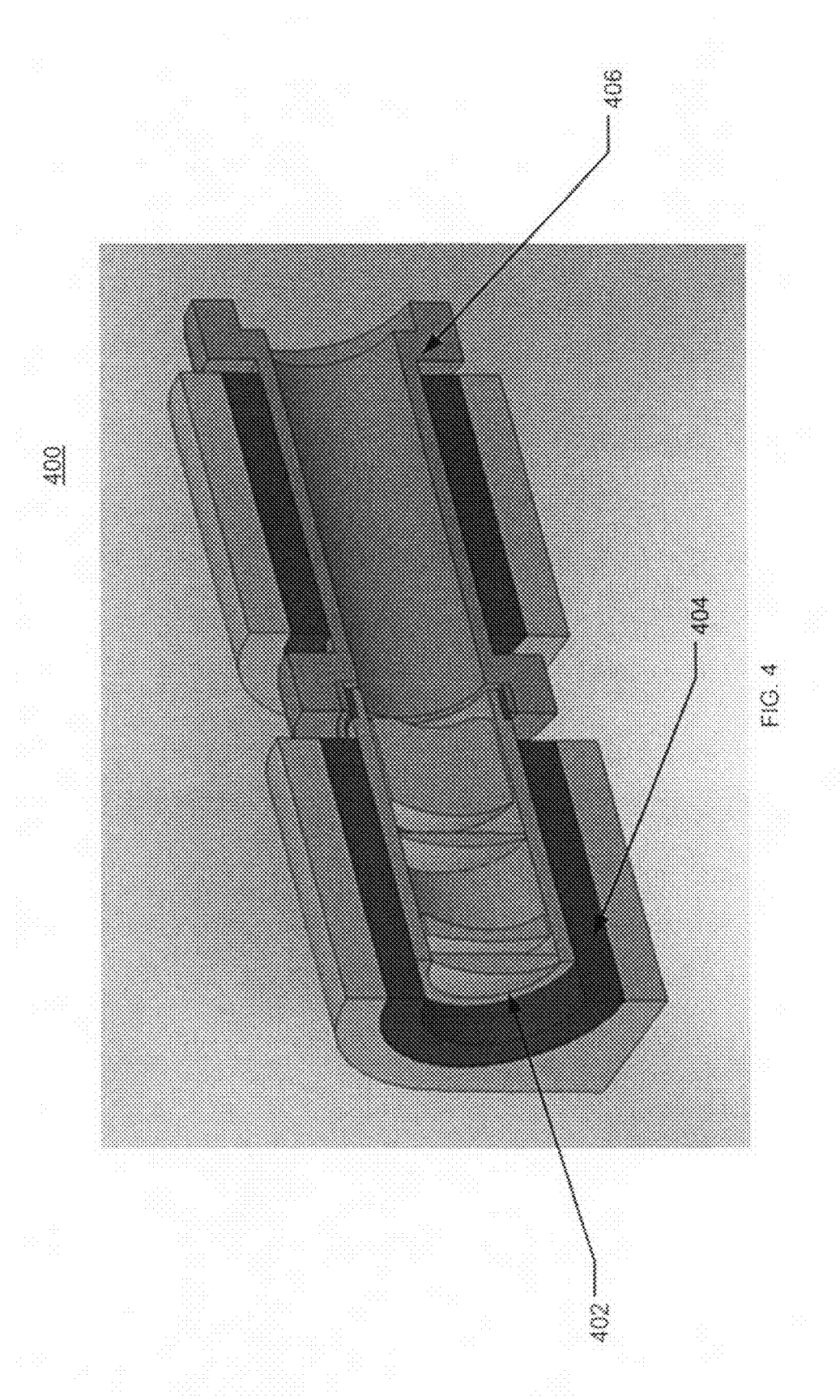
FIG. 4 illustrates an on-axis acting/reacting force unit according to an example embodiment.

FIG. 4 illustrates an on-axis acting/reacting force unit 400 according to an example embodiment.

Referring to FIG. 4, an objective 402 is enclosed in air or other bearings 404. The bearings 404 have a center of gravity (COG) aligned with the driving force. The unit 400 may be utilized with a relatively large aperture motor (e.g., voice coil) or any other off-axis motor solution (e.g., parallel motors) and with or without an on-axis counterweight mass 406 centered on the COG. The rotation of the objective 402 is inhibited by magnets or other types of external "rotation locks" such as an arm and a flat swiveling air bearing moving on a flat surface.

Figure 5:
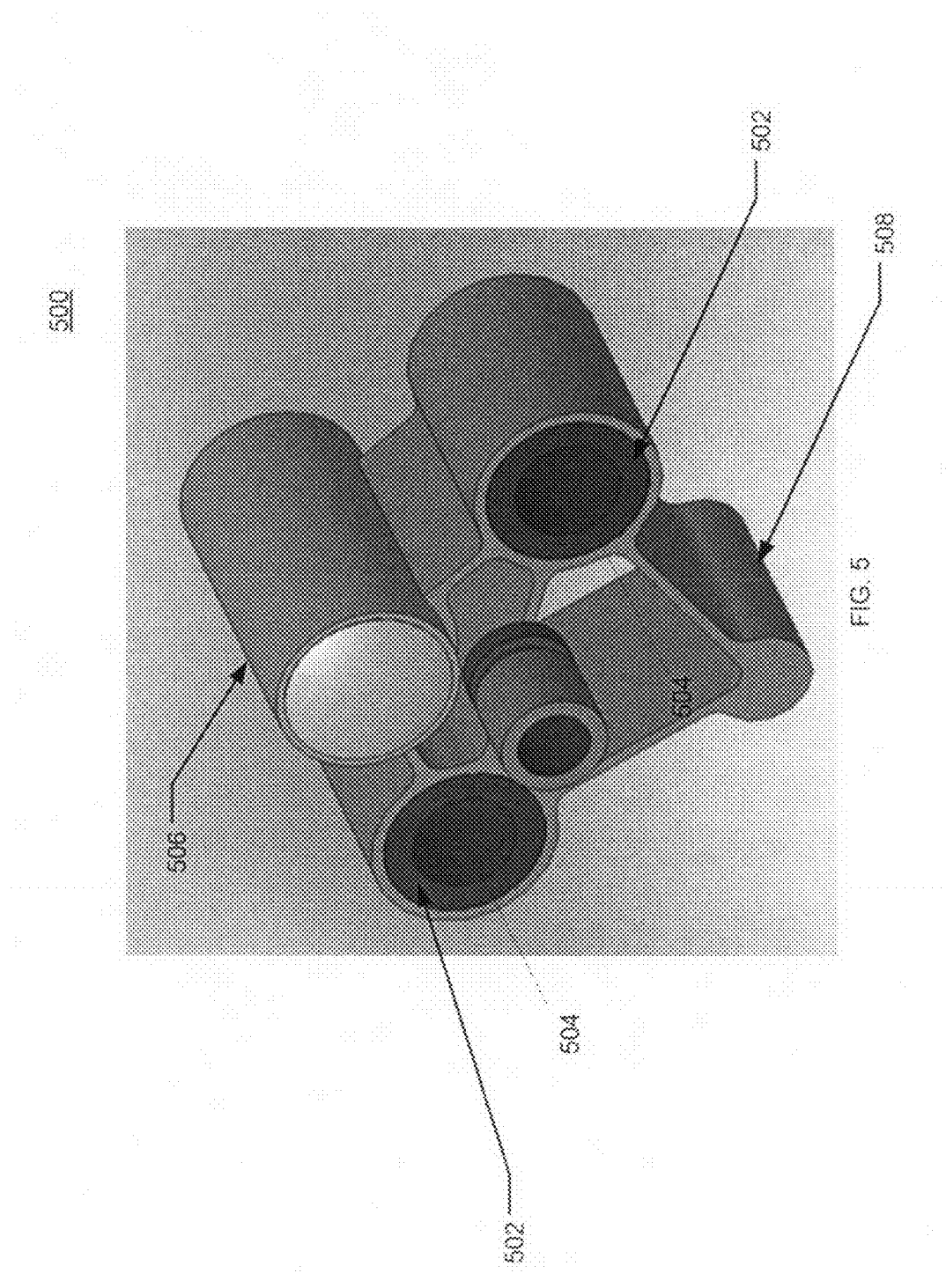
FIG. 5 shows an off-axis acting/reacting force unit according to an example embodiment.

FIG. 5 shows an off-axis acting/reacting force unit 500 according to an example embodiment.

Referring to FIG. 5, two or more parallel axes 504 use air or other bearings 502. The example embodiment shown in FIG. 5 provides a design in which the driving force is at the COG, with or without a counterweight mass and with the COG in the driving force direction. An objective 506 is positioned between the two parallel axes 504, but above the bearings 502. An extra mass 508 may be added or removed to get the COG in the middle between the parallel axes 504.

Figure 6:
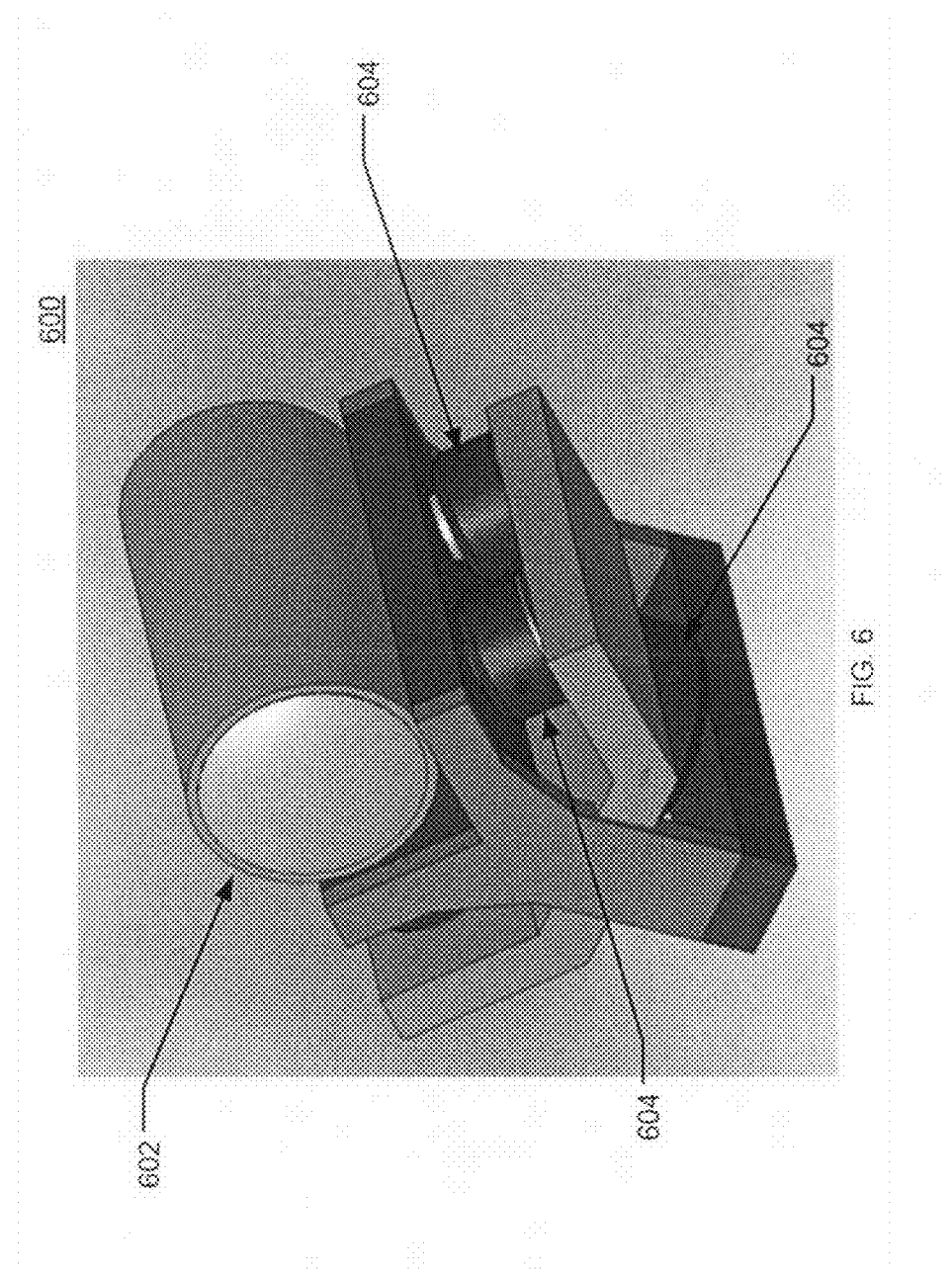
FIG. 6 shows an off-axis acting/reacting force unit according to another example embodiment.

FIG. 6 shows an off-axis acting/reacting force unit 600 according to another example embodiment.

Referring to FIG. 6, the driving force is applied at the COG, with or without a counterweight mass and with the COG in the driving force direction. Different configurations on bearings (e.g., air bearings) 604 may be used to design a kinematically determined assembly. The unit may also include an extra mass (not shown) and an objective 602.

Figure 7:
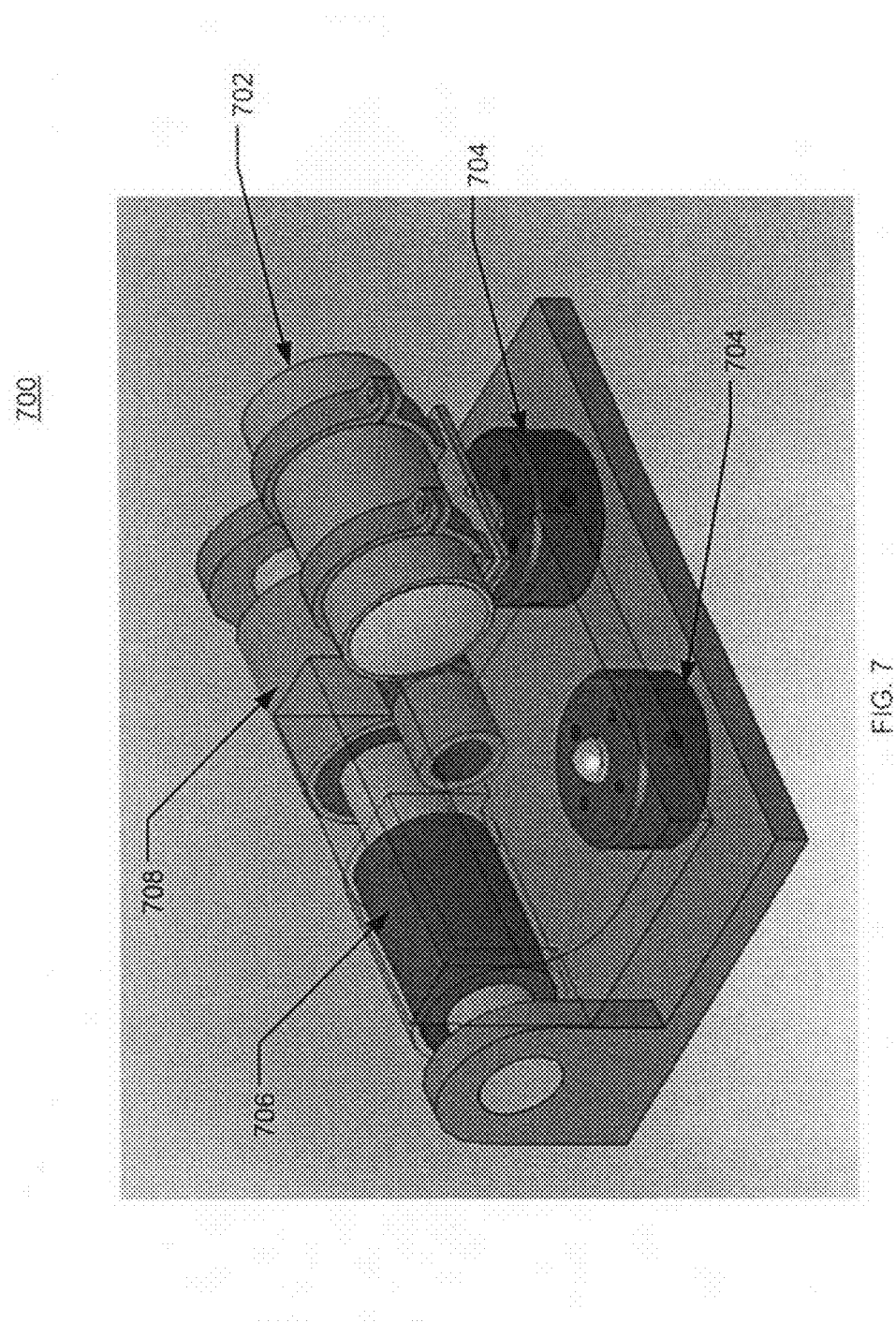
FIG. 7 shows an off-axis acting/reacting force unit according to yet another example embodiment.

FIG. 7 shows an off-axis acting/reacting force unit 700 according to yet another example embodiment.

Referring to FIG. 7, the driving force is applied at the COG, with or without a counterweight mass and with the COG in the driving force direction. By using different configuration on bearings (e.g., air bearings) 704, 706, 708, it is possible to design a kinematically determined assembly. The unit 700 may also include an extra mass (not shown) and an objective 702.

Example embodiments also provide methods and apparatuses in which refocusing (e.g., dynamic focusing) is performed with a deformable mirror, rather than a focus motor.

Figure 8:
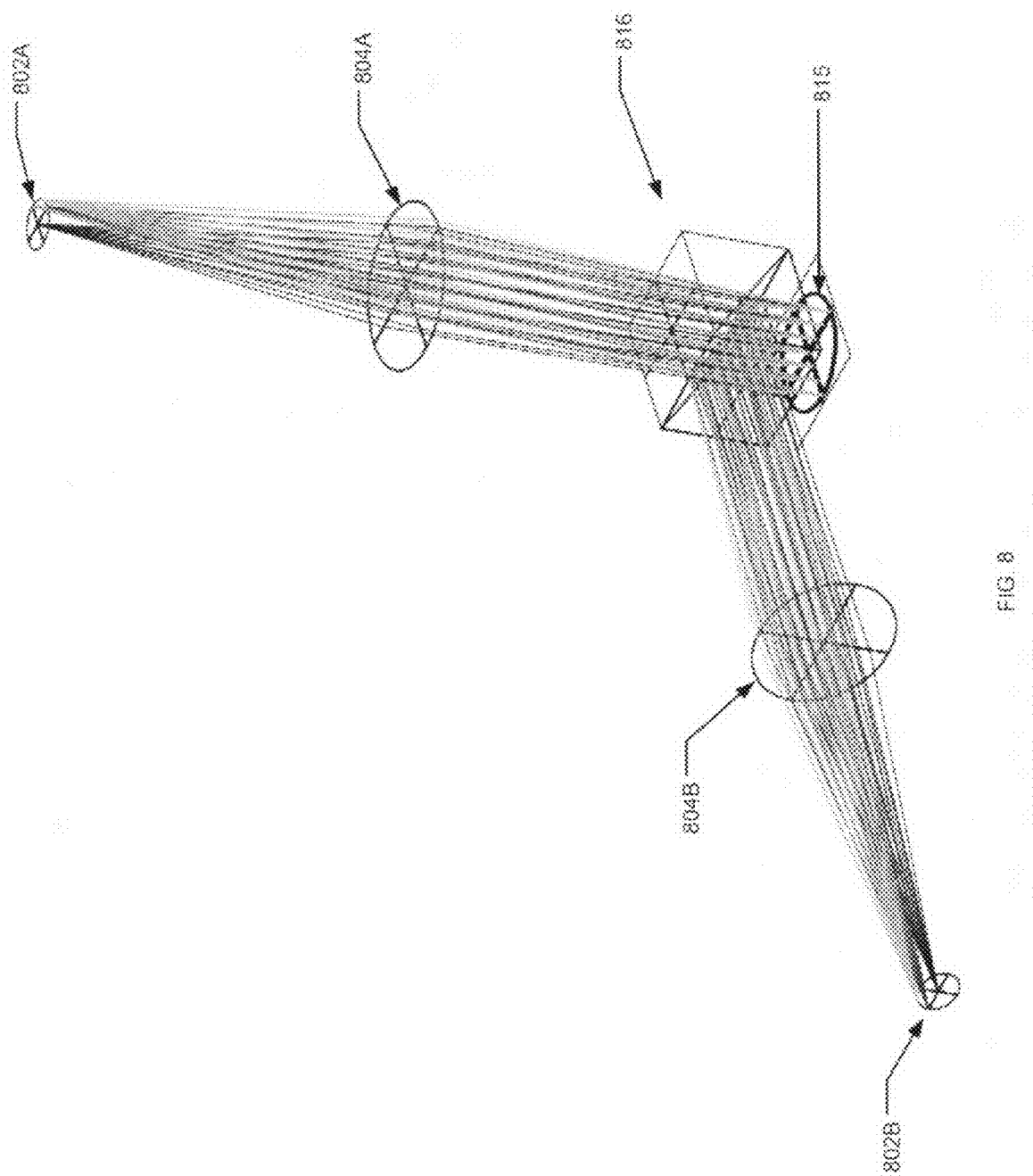
FIG. 8 illustrates an example embodiment of a focusing system in which refocusing is performed with a deformable mirror.

FIG. 8 illustrates an example embodiment of a focus system in which refocusing is performed with a deformable mirror.

Referring to FIG. 8, a deformable mirror 815 for refocusing is in a configuration with a beam splitter (e.g., polarization beam splitter) 816 (and possibly a wave plate) that allows light beams to reflect at normal angles and that separates incoming and outgoing beams. The beam splitter 816 directs light reflected from the deformable mirror 815 toward the plane 802B to generate an image.

In FIG. 8, 802A refers to an object plane whose image is projected onto plane 802B to generate the image. Generated beams pass through lens elements 804A/804B depending on their paths. The lens elements 804A/804B refer to function description of lenses (e.g., paraxial or ideal lenses), which may include one or more physical lens elements or lens assemblies.

The beam splitter 816 may be omitted, for example, by tilting the deformable mirror 815 thereby separating the incoming and outgoing beams. This may, however, limit the usable refocus range because sagittal and tangential rays have different focus positions for tilted rays reflected from a spherical mirror surface.

In the configuration shown in FIG. 8, the (implied) astigmatism appears even on-axis and is proportional to the square of the tilt angle multiplied by the defocus.

Skewed (tilted) rays are present even in the configuration with the polarization beam splitter 816 and wave plate, which limit the range of available refocus. However, this limitation is not severe because it is the mirror sag that determines the amount of refocus and the angle of the field point may be reduced by choosing a suitable focal length and corresponding mirror size.

The foregoing description of some example embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A pattern generation system comprising:
   an optical system configured to project a laser image onto an optical scanner; and
   a rotor having a plurality of optical arms arranged at a first angle relative to one another, the rotor further including the optical scanner; wherein
   the laser image is sequentially reflected by the optical scanner into each of the plurality of optical arms of the rotor to generate a pattern on a workpiece.

2. The pattern generation system of claim 1, wherein each of the plurality of optical arms prints an image scan with a certain bow length on the workpiece.

3. The pattern generation system of claim 2, wherein each optical arm operates sequentially to print a corresponding image scan, and a time period during which each optical arm prints the corresponding image scan do not overlap.

4. The pattern generation system of claim 3, wherein the laser image is in the form of a static beam, and a projection swap between each of the plurality of optical arms occurs when the static beam reaches an edge of the optical scanner.

5. The pattern generation system of claim 1, wherein the optical scanner and the plurality of optical arms rotate at a constant speed.

6. The pattern generation system of claim 1, wherein the optical scanner is a pyramid optical scanner in the form of a rotatable prism.

7. The pattern generation system of claim 1, further comprising:
   a focusing system configured to change a nominal focus position according to at least one of a topography map of the workpiece and focus length variations between the plurality of optical arms one of during and after a projection swap between the plurality of optical arms.

8. The pattern generation system of claim 7, wherein the focusing system comprises:
   a focusing apparatus configured to change the nominal focus position according to at least one of the topography map of the workpiece and the focus length variations between the plurality of optical arms one of during and after a projection swap between the plurality of optical arms; and
   a focus motor configured to drive the focusing apparatus.

9. The pattern generation system of claim 8, further comprising: a focus sensor configured to provide position information to the focus motor; wherein
   the focus motor is positioned using a linear optical encoder and according to at least one of the position information provided by the focus sensor and a topography of the workpiece.

10. The pattern generation system of claim 9, wherein the focus sensor provides real-time position information for dynamic refocusing during simultaneous scanning of an optical arm processing the workpiece.

11. The pattern generation system of claim 9, wherein the focus sensor provides position information from a previous scan of the workpiece.

12. The pattern generation system of claim 9, wherein the focus sensor is located in the same or a different optical arm as the optical arm using the position information for processing the workpiece.

13. The pattern generation system of claim 9, wherein the focus sensor comprises:
   an array of sensors configured to provide a workpiece topography map.

14. The pattern generation system of claim 8, wherein the focus motor comprises:
   a counterweight configured to counteract forces acting on moving portions of the pattern generation system.

15. The pattern generation system of claim 14, wherein the focus motor further comprises:
   a motor body adhered to the counterweight by a thermally conductive adhesive such that heat transfers to the counterweight, which acts as a cooling flange.

16. The pattern generation system of claim 14, wherein the focus motor further comprises:
   a hose connected to the counterweight, the hose being configured to cool the focus motor by vacuum suction.

17. The pattern generation system of claim 14, further comprising:
   a soft hose connected to the counterweight and configured to supply air to the counterweight.

18. The pattern generation system of claim 14, wherein the focus motor further comprises:
   a damper ring mounted on the counterweight and configured to suppress damage caused by collisions between a counterweight and an actuating assembly of the focus motor.

19. The pattern generation system of claim 8, wherein strokes of the focus motor adapt to different thicknesses of the workpiece.

20. The pattern generation system of claim 8, wherein the focus motor functions at different nominal positions depending on a height of the workpiece.

21. The pattern generation system of claim 8, wherein the focus motor further comprises:
   viscous dampers mounted at end strokes and configured to suppress crash damage to the focus motor.

22. The pattern generation system of claim 1, further comprising:
   a focusing system configured to change a focus position of a writing beam for projecting the laser image based on position information from a focus sensor.

23. The pattern generation system of claim 22, wherein the focusing system comprises:
a deformable mirror configured to refocus the writing beam.

24. The pattern generation system of claim 23, wherein the focusing system further comprises:
a beam splitter configured to direct light reflected from the deformable mirror toward a plane to generate the pattern on the workpiece.

25. The pattern generation system of claim 22, wherein the focusing system comprises:
a focusing apparatus configured to change the focus position of the writing beam for projecting the laser image based on position information from the focus sensor; and
a focus motor configured to drive the focusing apparatus.

26. The pattern generation system of claim 8, wherein the focus motor comprises:
an acting/reacting force unit configured such that an acting/reacting force is applied in parallel with movement of an actuating portion of the focus motor.

27. The pattern generation system of claim 26, wherein the acting/reacting force unit is an on-axis acting/reacting force unit comprising:
an objective enclosed in bearings, the bearings having a center of gravity aligned with a driving force of the focus motor.

28. The pattern generation system of claim 26, wherein the acting/reacting force unit is an off-axis acting/reacting force unit configured such that a driving force of the focus motor is at the center of gravity and the center of gravity is in the driving force direction.

29. A method for generating a pattern on a workpiece, the method comprising:
projecting, by an optical system, a laser image onto an optical scanner; and
sequentially reflecting, by the optical scanner, the laser image into each of a plurality of optical arms of a rotor to generate a pattern on a workpiece.

30. The method of claim 29, wherein each of the plurality of optical arms prints an image scan with a certain bow length on the workpiece.

31. The method of claim 30, wherein each optical arm operates sequentially to print a corresponding image scan, and the time periods during which each of the plurality of optical arms prints the corresponding image scan do not overlap.

32. The method of claim 31, wherein the laser image is in the form of a static beam, and a projection swap between each of the plurality of optical arms occurs when the static beam reaches a corresponding edge of the optical scanner.

33. The method of claim 29, wherein the optical scanner and the plurality of optical arms rotate at a constant speed.

34. The method of claim 29, further comprising:
changing, by a focusing system, a nominal focus position according to at least one of a topography of the workpiece and focus length variations between the plurality of optical arms at least one of during and after a projection swap.

35. A rotor for implementation in a pattern generator or other tool, the rotor comprising:
an optical scanner; and
a plurality of optical arms arranged at a first angle relative to one another; wherein
a laser image is sequentially reflected by the optical scanner into each of the plurality of optical arms of the rotor to generate a pattern on a workpiece.

36. The rotor of claim 35, wherein each of the plurality of optical arms prints an image scan with a certain bow length on the workpiece.

37. The rotor of claim 36, wherein each optical arm operates sequentially to print a corresponding image scan, and the time periods during which each of the plurality of optical arms prints the corresponding image scan do not overlap.

38. The rotor of claim 37, wherein the laser image is in the form of a static beam, and a projection swap between each of the plurality of optical arms occurs when the static beam reaches a corresponding edge of the optical scanner.

39. The rotor of claim 35, wherein the optical scanner and the plurality of optical arms rotate at a constant speed.

* * * * *